(12) United States Patent
Sturcken et al.

(10) Patent No.: US 11,894,286 B2
(45) Date of Patent: Feb. 6, 2024

(54) HERMETICALLY SEALED ELECTRONICS MODULE WITH ENHANCED COOLING OF CORE INTEGRATED CIRCUIT

(71) Applicant: BAE Systems Information and Electronic Systems Integration Inc., Nashua, NH (US)

(72) Inventors: Keith K Sturcken, Nokesville, VA (US); Kenneth J. Cross, Manassas, VA (US); Michael J. O'Connor, Manassas Park, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 15 days.

(21) Appl. No.: 17/274,814

(22) PCT Filed: Jun. 13, 2019

(86) PCT No.: PCT/US2019/036891
§ 371 (c)(1),
(2) Date: Mar. 10, 2021

(87) PCT Pub. No.: WO2020/251574
PCT Pub. Date: Dec. 17, 2020

(65) Prior Publication Data
US 2022/0051966 A1    Feb. 17, 2022

(51) Int. Cl.
*H01L 23/42* (2006.01)
*H01L 21/66* (2006.01)
*H01L 23/495* (2006.01)

(52) U.S. Cl.
CPC ............. *H01L 23/42* (2013.01); *H01L 22/12* (2013.01); *H01L 23/49568* (2013.01)

(58) Field of Classification Search
CPC ......... H01L 21/48; H01L 21/50; H01L 22/12; H01L 23/00; H01L 23/10; H01L 23/34;
(Continued)

(56) References Cited

U.S. PATENT DOCUMENTS

| 5,323,292 A | * | 6/1994 | Brzezinski | ............ H01L 23/433 361/689 |
| 5,783,464 A | | 7/1998 | Burns | |

(Continued)

FOREIGN PATENT DOCUMENTS

JP    2011236494 A  * 11/2011  ............. H01L 24/29

OTHER PUBLICATIONS

JP-2011236494-A English Translation (Year: 2011).*
International Search Report, PCT/US2019/036891, dated Sep. 4, 2019, 9 pages.

*Primary Examiner* — Amir A Jalali
(74) *Attorney, Agent, or Firm* — Gary McFaline; Maine Cernota & Curran

(57) ABSTRACT

A hermetically sealed electronics module includes a core IC installed on a substrate. A collar surrounds the core IC and is sealed to the substrate and to a lid, forming a sealed chamber. A heat spreader bonded to an internal surface of the lid extends downward into proximal thermal contact with the core IC. A thin layer of TIM can be applied between the heat spreader and core IC. The heat spreader does not overlap any tall components that extend above the core IC, and can extend over regions adjacent to the core IC. Tall components can be limited to a periphery of the chamber, and/or the heat spreader can include openings that surround central tall components. The heat spreader can be soldered or welded to the lid over an entire upper surface of the heat spreader. X-ray and/or CSAM scanning can detect heat spreader bonding flaws.

15 Claims, 9 Drawing Sheets

(58) Field of Classification Search
CPC ..... H01L 23/36; H01L 23/367; H01L 23/373; H01L 23/3672; H01L 23/3675; H01L 23/3677; H01L 23/40; H01L 23/433; H01L 23/467; H01L 23/49568; H01L 23/52; H01L 24/00; H01L 24/16; H01L 24/32; H01L 24/73; H01L 25/00; H01L 25/165; H01L 25/50; H01L 2224/16225; H01L 2224/32221; H01L 2224/73253; H01L 2924/19105; H05K 7/20; H05K 7/2039; H05K 7/20454; H05K 7/20463; H05K 7/20472; H05K 7/205; H05K 7/2089–209

See application file for complete search history.

(56) References Cited

U.S. PATENT DOCUMENTS

| | | | |
|---|---|---|---|
| 6,212,074 B1* | 4/2001 | Gonsalves | H01L 23/4275 174/16.3 |
| 6,858,795 B2 | 2/2005 | Czjakowski et al. | |
| 10,548,239 B1* | 1/2020 | Iyengar | G06F 1/20 |
| 11,456,232 B2* | 9/2022 | Wan | H01L 23/3675 |
| 2004/0057214 A1* | 3/2004 | Alcoe | H01L 23/10 257/E23.101 |
| 2005/0224953 A1 | 10/2005 | Lee et al. | |
| 2005/0280142 A1* | 12/2005 | Hua | H01L 23/3736 257/E23.09 |
| 2007/0133171 A1 | 6/2007 | Cheon | |
| 2007/0230130 A1* | 10/2007 | Alcoe | H01L 23/3735 257/E23.09 |
| 2010/0084761 A1* | 4/2010 | Shinagawa | H01L 25/0655 438/117 |
| 2010/0195285 A1 | 8/2010 | Noshadi et al. | |
| 2012/0034403 A1 | 2/2012 | Paterek et al. | |
| 2012/0098118 A1* | 4/2012 | Lin | H01L 21/563 257/713 |
| 2013/0043581 A1* | 2/2013 | Negoro | H01L 23/36 257/E23.08 |
| 2014/0167216 A1* | 6/2014 | Kalchuri | H01L 25/16 257/532 |
| 2014/0264799 A1* | 9/2014 | Gowda | H01L 23/49568 438/122 |
| 2014/0355218 A1* | 12/2014 | Vinciarelli | H05K 5/065 361/728 |
| 2015/0170989 A1* | 6/2015 | Dhavaleswarapu | H01L 23/3675 438/122 |
| 2015/0173243 A1* | 6/2015 | Chauhan | F28D 15/04 165/104.26 |
| 2015/0289414 A1* | 10/2015 | Berard | H01L 21/50 29/890.032 |
| 2016/0225742 A1* | 8/2016 | Davis | H01L 29/0657 |
| 2016/0284622 A1* | 9/2016 | Mitsui | H01L 23/4006 |
| 2017/0186665 A1* | 6/2017 | Choudhury | H01L 23/42 |
| 2018/0166415 A1 | 6/2018 | Khaselev et al. | |
| 2019/0348340 A1* | 11/2019 | Kwon | H01L 23/3675 |
| 2020/0091034 A1* | 3/2020 | Shao | H01L 24/13 |
| 2020/0098661 A1* | 3/2020 | Lofgreen | H01L 23/367 |
| 2020/0350229 A1* | 11/2020 | Chang | H01L 23/3733 |

\* cited by examiner

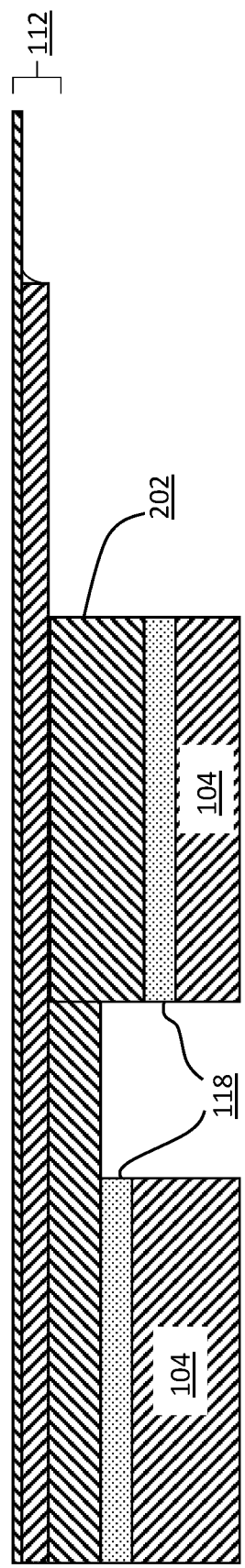

HERMETICALLY SEALED ELECTRONICS MODULE WITH ENHANCED COOLING OF CORE INTEGRATED CIRCUIT

FIELD

The disclosure relates to apparatus and methods for cooling electronic circuits, and more particularly to apparatus and methods for cooling hermetically sealed integrated circuits deployed in space.

BACKGROUND

Dissipation of the heat generated by integrated circuits and modules is a common issue that arises in electronic design. As integrated circuits and modules have become increasingly dense and complex, this problem has become more acute. Often, the problem can be addressed simply by applying a "heat sink" to the circuit or module (referred to generically herein as an integrated circuit or "IC"), where the heat sink has a relatively large surface area that can transfer heat to the surrounding air. A heat sink compound or Thermal Interface Material (TIM) is often applied as an interface between the IC and the heat sink, so as to improve thermal flow from the IC to the heat sink. In more severe cases, it can be necessary to circulate air past the heat sink using a fan, and in extreme cases circuits or modules sometimes need to be cooled by circulating water or oil.

For electronics that are deployed in space, however, most of these heat dissipation methods cannot be used. Obviously, there is no air in space, so traditional heat sinks and cooling fans are not applicable. Furthermore, due to requirements for very high reliability, it is generally required that space-deployed electronics be hermetically sealed at the point of manufacture, so that they are protected from off-gassing of surrounding materials and other environmental contaminants during the intervening time until launch. Hermetically sealing the electronics can also be important for containing materials off-gassed by components within the device. This also helps to diminish the effects of space radiation, which can otherwise lead to radiation-induced memory "upsets" and other temporary and/or permanent damage.

Hermetic sealing of space-based ICs and other modules severely limits access to the circuits, and thereby further complicates efforts to dissipate heat. FIG. 1A illustrates a typical application specific integrated circuit (ASIC) or similar module as it might typically be configured for use in space. The module 100 comprises a substrate 102 onto which is installed at least one high density integrated circuit, such as a "very large scale integrated circuit" (VLSIC) 104, referred to herein generically as a "core" IC 104. In addition, other integrated circuits 106 and/or other supporting electronics 108 such as banks of capacitors or resistors are also installed on the substrate 102. The substrate 102 includes interconnection pins 126 that provide interconnection via circuit boards, cables, etc. with other circuits and modules. A metallic collar 110, also known as a seal ring, is sealed to the substrate 102 and surrounds the electronics 104, 106, 108, and a lid 112 is hermetically sealed to the collar 110, for example by a seam weld 114, thereby forming a hermetically sealed chamber 116 that contains the electronics 104, 106, 108.

It is necessary to make the collar 110 sufficiently tall to raise the lid 112 above all of the internal components 104, 106, 108. Typically, at least some of the components 108 are significantly taller than the core IC 104, such that the lid 112 is raised above and physically separated from the core IC.

Frequently, the lid 112 is made from a metal alloy such as Kovar™ that has a thermal expansion coefficient that is similar to glasses and ceramics (note: Kovar is a trademark of CRS Holdings, Inc., Delaware, USA). Kovar is also a material that provides good thermal conductivity, and is effective at providing additional radiation shielding to the module 100. Thermal Interface Material (TIM) 118 is typically used to fill in this gap between the lid 112 and the core IC 104, but the TIM material is not a good heat conductor as compared to a metal, and for that reason the heat conduction across the relatively thick layer of TIM 118 is sometimes insufficient for cooling the core IC 104. In FIG. 1A, the TIM 118 is shown only over the core IC 104. FIG. 1B is a detail that illustrates the relationship between the lid 112, TIM 118, and core IC 104 of FIG. 1A.

One possibility is to circulate oil or some other cooling medium through the hermetic space 116 so as to remove the heat, but that approach would be expensive, complex, and heavy, and would require penetration of the hermetic space 116, which would increase the risk of leaks.

With reference to FIG. 1C, according to another approach 150 that is disclosed in U.S. Pat. No. 9,502,269, which is assigned to the present Applicant and is incorporated herein in its entirety for all purposes, a portion 120 of the lid 112 that is located over the core IC 104 can be stamped or otherwise offset downward so that it extends down to the top of the core IC 104. An opening 122 can be formed in the depressed region 120 of the lid 112, and the rim of this opening can be bonded to the top of the core IC 104, for example using a low temperature solder, so that the hermetic seal is maintained, but the top of the core IC 104 is thermally exposed. A heat extractor 124 can then be bonded directly to the core IC 104 and can be used to remove the excess heat that is generated by the core IC 104.

The approach of U.S. Pat. No. 9,502,269 is very effective for removing heat, in that it avoids the use of TIM entirely and instead withdraws heat directly from the core IC 104. However, for some applications this approach may not be practical. For example, the required manufacturing and testing steps may be too complex, and therefore too expensive for certain applications. Also the core IC 104 may be sensitive to thermal stresses if solder is used to bond the lid 112 to the core IC 104, and/or it may be difficult to form bonds between the lid 112 and the core IC 104, e.g. using adhesives, without incurring an unacceptable risk of leaks, which may not appear until after the module is subjected to the mechanical and thermal stresses of launch. This approach is even further complicated if there is more than one core IC 104 in the module 100.

What is needed, therefore, is an apparatus and method for improving heat removal from a core IC installed within a hermetically sealed module without requiring penetration of the hermetic seal, and without requiring that elements of the apparatus be directly bonded to the core IC.

SUMMARY

The present disclosure is an apparatus and method for improving heat removal from a core IC installed within a hermetically sealed module without requiring penetration of the hermetic seal, and without requiring that elements of the apparatus be directly bonded to the core IC. The hermetically sealed module includes substrate onto which is installed at least one high density integrated circuit, such as a "very large scale integrated circuit" (VLSIC), referred to herein generically as a "core" IC. In addition, other integrated circuits and/or other supporting electronics such as banks of capacitors or resistors may also be installed on the substrate. A metallic collar is sealed to the substrate and surrounds the electronics, and a lid is hermetically sealed to the collar, for example by a seam weld, thereby forming a hermetically sealed chamber that contains the electronics.

According to the present disclosure, a "heat spreader" is soldered, welded, or otherwise bonded to the interior surface of the lid before the lid is attached to the module. In embodiments, the heat spreader is bonded to the lid over the entire upper surface of the heat spreader. The heat spreader is configured to occupy at least the region of the lid that is directly above the core IC, and it is configured to be sufficiently thick to extend downward from the lid nearly to the top surface of the core IC.

A thin layer of TIM is used to fill the small gap between the heat spreader and the top of the core IC, thereby ensuring a good thermal interface between the heat spreader and the core IC, while also reducing the manufacturing tolerance requirements of the apparatus. Because this layer of TIM is very thin, as compared e.g. to the prior art approach of FIG. 1A, it does not significantly hinder heat flow from the core IC into the heat spreader. Accordingly, heat flows freely from the core IC through the thin layer of TIM and into the heat spreader. And because the heat spreader is e.g. soldered or welded to the inner surface of the lid, the heat flows from the heat spreader into the lid, from which it can be easily removed, for example using a heat extractor similar to the extractor 124 that is illustrated in FIG. 1B.

In embodiments, the heat spreader extends beyond the region that is immediately above the core IC, and covers a significant area of the top of the hermetically sealed chamber, while avoiding regions that are directly above any "tall" components in the hermetically sealed chamber, where "tall" components are defined in this context to be components within the hermetically sealed chamber that are taller than the core IC. This approach provides a maximal thermal contact and transfer between the heat spreader and the lid. Some embodiments are configured such that all of the "tall" components are located near the periphery of the module, such that the heat spreader can be confined to a central region of the lid, for example as a simple rectangle. In other embodiments, the tall components are distributed more generally throughout the hermetically sealed chamber, and the heat spreader is configured with a more complex shape that, in some embodiments, includes holes in the heat spreader that are positioned over corresponding tall elements.

Embodiments include more than one "core" IC, where a core IC is defined herein as any IC or other element within the hermetically sealed chamber that requires close contact with the heat spreader for cooling thereof.

In embodiments, the lid 112 and collar 110 are made from a metal alloy such as Kovar™ having a thermal expansion coefficient that is similar to glasses and ceramics (note: Kovar is a trademark of CRS Holdings, Inc., Delaware, USA), so as to reduce thermal stresses between the metallic components and the underlying, ceramic substrate (element 102 in FIGS. 1A and 1B). In various embodiments, the heat spreader is made from molybdenum.

Also disclosed herein is a method of manufacturing a hermetically sealed electronic module, whereby a metallic heat spreader, such as a molybdenum heat spreader is configured so that it will not overlap any "tall" components in the module, after which the heat spreader is soldered, welded, or otherwise bonded to the internal surface of a metallic lid, for example by using gold-tin solder, which are highly conductive thermally, prior to seam welding or otherwise bonding the lid to a collar provided as part of the module. In embodiments, before the lid is bonded to the collar it is examined using at least one of X-ray and CSAM (Confocal Scanning Acoustic Microscopy) so as to detect defects such as voids between the heat spreader and the lid.

One general aspect of the present disclosure is a hermetically sealed electronics module that includes an interconnecting substrate, a core integrated circuit (IC) installed on the substrate, a collar having a bottom edge hermetically bonded to the substrate, said collar being configured such that it surrounds and encircles the core IC, a lid hermetically sealed to a top edge of the collar, the lid, collar, and substrate together forming and enclosing a hermetically sealed chamber that contains the core IC, and a heat spreader bonded to an inward-facing surface of the lid and positioned within the hermetically sealed chamber over the core IC, the heat spreader extending downward from the lid into proximal, thermal contact with an upper surface of the core IC.

Embodiments further include a tall component installed on the interconnecting substrate within the hermetically sealed chamber, the tall component extending upward from the substrate to a height that is greater than a height of the upper surface of the core IC, the heat spreader being configured such that it does not overlap the tall component, and such that it extends downward below the height of the tall component.

In some of these embodiments the module comprises a plurality of tall components installed on the interconnecting substrate, all of the tall components extending upward from the substrate to heights that are greater than the height of the upper surface of the core IC, the heat spreader being configured such that it does not overlap any of the tall components, and such that it extends downward below the heights of all of the tall components.

In some of these embodiments all of the tall components are installed within the hermetically sealed chamber proximal to the collar, and the heat spreader is confined to a central region of the lid. In other of these embodiments, at least one of the tall components is a central tall component that is located within a central region of the interconnecting substrate, and wherein an opening is provided in the heat spreader above the central tall component so that the heat spreader surrounds but does not overlap the central tall component.

In any of the above embodiments, the heat spreader can be bonded to the lid over substantially an entire upper surface of the heat spreader.

In any of the above embodiments, the heat spreader can be soldered or welded to the lid.

In any of the above embodiments, the proximal, thermal contact between the heat spreader and the upper surface of the core IC can be formed by a layer of thermal interface material (TIM) interposed between and in physical contact with both the heat spreader and the upper surface of the core IC.

In any of the above embodiments, the heat spreader can be configured to extend beyond the upper surface of the core IC, so that it overlaps a region within the hermetically sealed chamber that is adjacent to the core IC.

In any of the above embodiments, a plurality of core ICs can be installed on the interconnecting substrate within the hermetically sealed chamber, the heat spreader can be positioned within the hermetically sealed chamber over all of the core ICs, and the heat spreader can extend downward from the lid into proximal, thermal contact with upper surfaces of all of the core ICs.

In some of these embodiments, at least two of the core ICs differ in height, and wherein a thickness of the heat spreader is non-uniform, and is varied so as to be proximal to the upper surfaces of the core ICs according to their heights.

A second general aspect of the present disclosure is a method of manufacturing a hermetically sealed electronics module. The method includes the following steps:
 a) providing an interconnecting substrate;
 b) installing a core integrated circuit (IC) installed on the substrate;
 c) hermetically bonding a bottom edge of a collar to the substrate so that the collar is in surrounding relationship with the core IC;
 d) providing a lid configured for hermetic attachment to a top edge of the collar;
 e) bonding a heat spreader to an inward-facing surface of the lid, the heat spreader being configured such that when the lid is hermetically attached to the collar, the heat spreader will be positioned over the core IC within the hermetically sealed chamber, and will extend downward from the lid into proximal, thermal contact with an upper surface of the core IC; and
 f) hermetically attaching the lid to the top edge of the collar, the lid, collar, and substrate together thereby forming and enclosing a hermetically sealed chamber that contains the core IC.

In embodiments, bonding the heat spreader to the inward-facing surface of the lid in step e) includes at least one of soldering and welding the heat spreader to the lid.

In any of the above embodiments, bonding the heat spreader to the inward-facing surface of the lid in step e) can include bonding substantially an entire upper surface of the heat spreader to the inward-facing surface of the lid.

Any of the above embodiments can further include, after step e) and before step f), applying at least one of X-ray scanning and CSAM (Confocal Scanning Acoustic Microscopy) scanning to the bonded lid and heat spreader.

Any of the above embodiments can further include, before step f), applying a layer of thermal interface material (TIM) to the upper surface of the core IC, such that after step f) the proximal, thermal contact between the heat spreader and the upper surface of the core IC is formed by a layer of the TIM interposed between an in physical contact with both the heat spreader and the upper surface of the core IC.

In any of the above embodiments, hermetically attaching the lid to the top edge of the collar in step f) can include seam-welding the lid to the top edge of the collar.

And in any of the above embodiments, bonding the heat spreader to the inward-facing surface of the lid in step e) can include bonding the heat spreader to the lid over substantially an entire upper surface of the heat spreader.

The features and advantages described herein are not all-inclusive and, in particular, many additional features and advantages be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2B is a close-up detail of the embodiment of FIG. 2A;

DETAILED DESCRIPTION

Figure 2A:
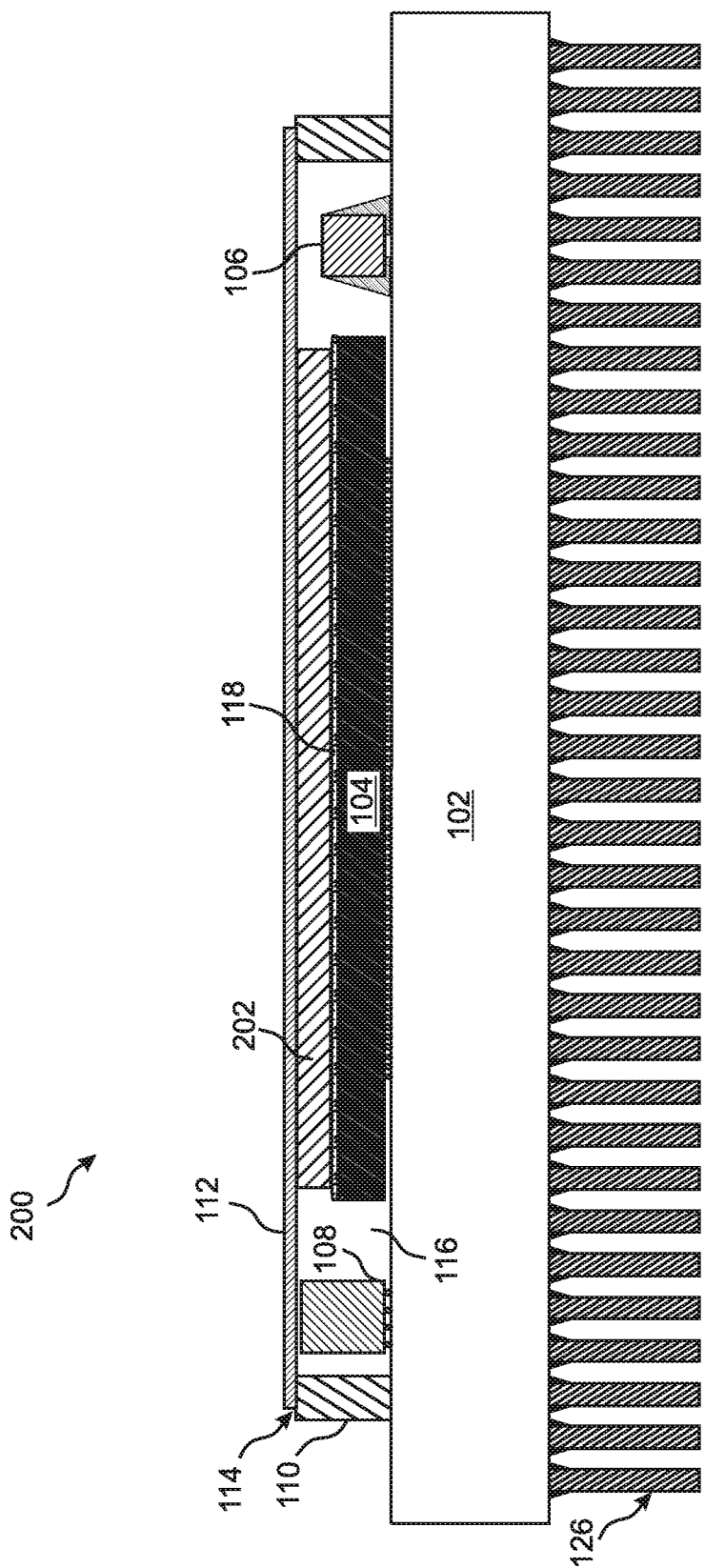
FIG. 2A is a cross-sectional illustration of a hermetically sealed electronics chamber according to an embodiment of the present disclosure.

With reference to FIG. 2A, the present disclosure is an apparatus 200 and method for improving heat removal from a core IC 104 installed within a hermetically sealed chamber 116 without requiring penetration of the seal that surrounds the chamber 116, and without requiring that elements of the apparatus be directly bonded to the core IC 104.

The apparatus 200 comprises a substrate 102 onto which the core IC 104 is installed, where the core IC can be a high density integrated circuit, such as a "very large scale integrated circuit" (VLSIC). In addition, embodiments include additional integrated circuits 106 and/or other supporting electronics 108, such as banks of capacitors or resistors installed on the substrate 102. The substrate 102 includes interconnection pins 126 that provide interconnection via circuit boards, cables, etc. with other circuits and modules. A collar 110, which in embodiments is a metallic collar, is sealed to the substrate 102 and surrounds the electronics 104, 106, 108, and a lid 112 is hermetically sealed to the collar 110, for example by a seam weld 114, thereby forming the hermetically sealed chamber 116 that contains the electronics 104, 106, 108. In embodiments, the surrounding collar runs about a perimeter of the module and encircles the electronic elements.

According to the present disclosure, before the lid 112 is bonded to the collar 110 a "heat spreader" 202 is soldered, welded, or otherwise bonded to the interior surface of the lid 112. In embodiments, the heat spreader 202 is bonded to the lid 112 over the entire upper surface of the heat spreader 202, which ensures maximal heat transfer from the spreader 202 to the lid 112. The heat spreader 202 is configured to occupy at least the region of the lid 112 that is directly above the core IC 104, and it is configured to be sufficiently thick to extend downward from the lid 112 nearly to the top surface of the core IC 104.

Figure 1A:
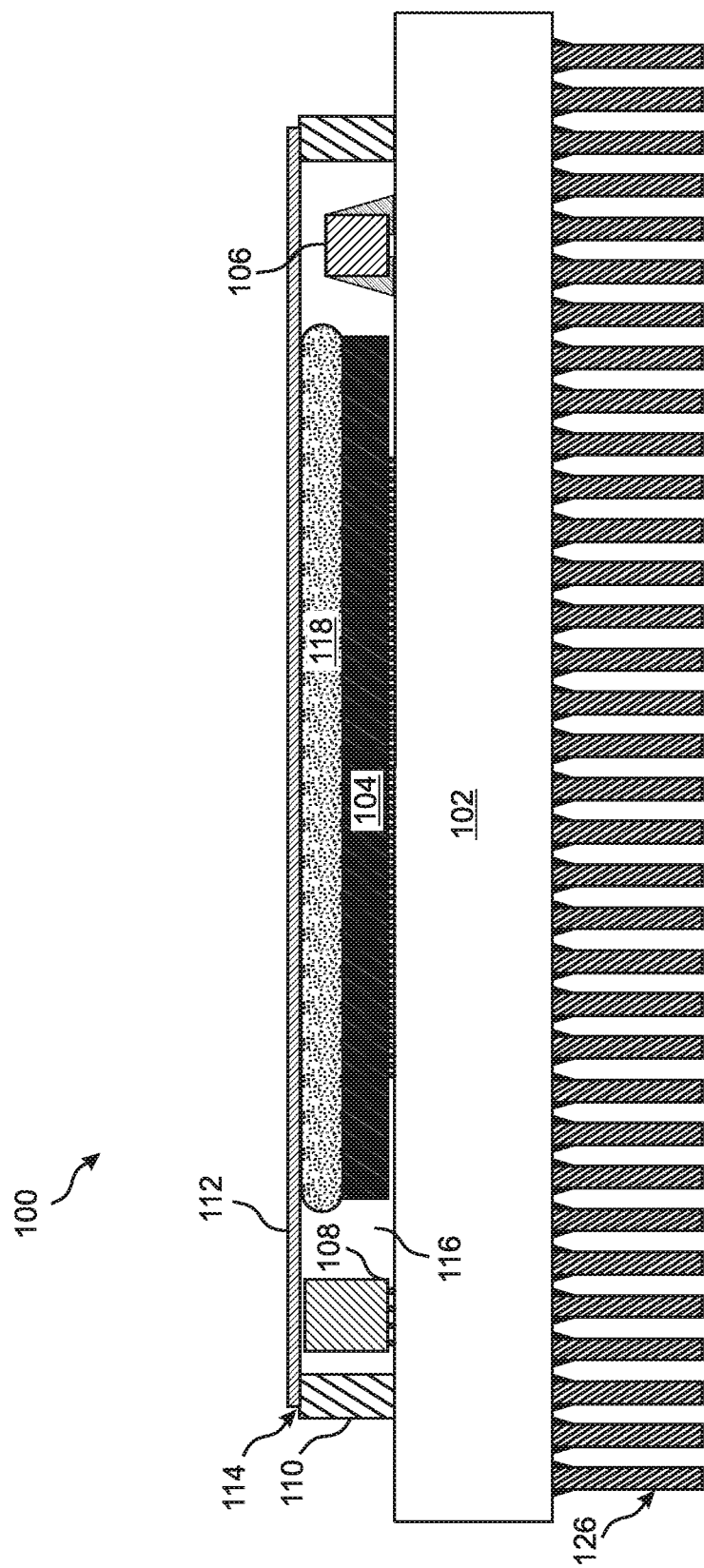
FIG. 1A is a cross-sectional illustration of a hermetically sealed electronics chamber of the prior art.
Figure 1B:
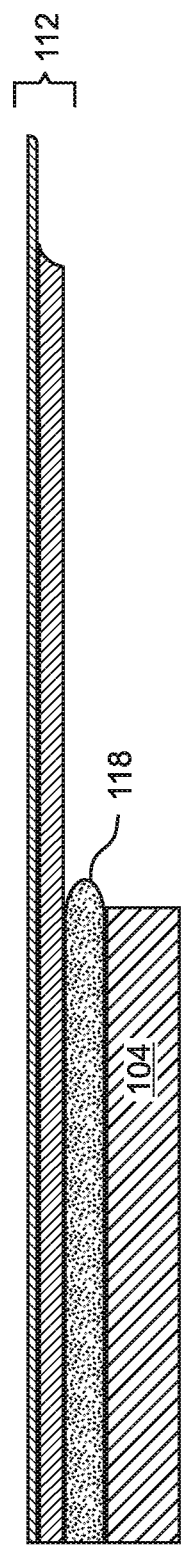
FIG. 1B is a close-up detail of the prior art example of FIG. 1A.
Figure 1C:
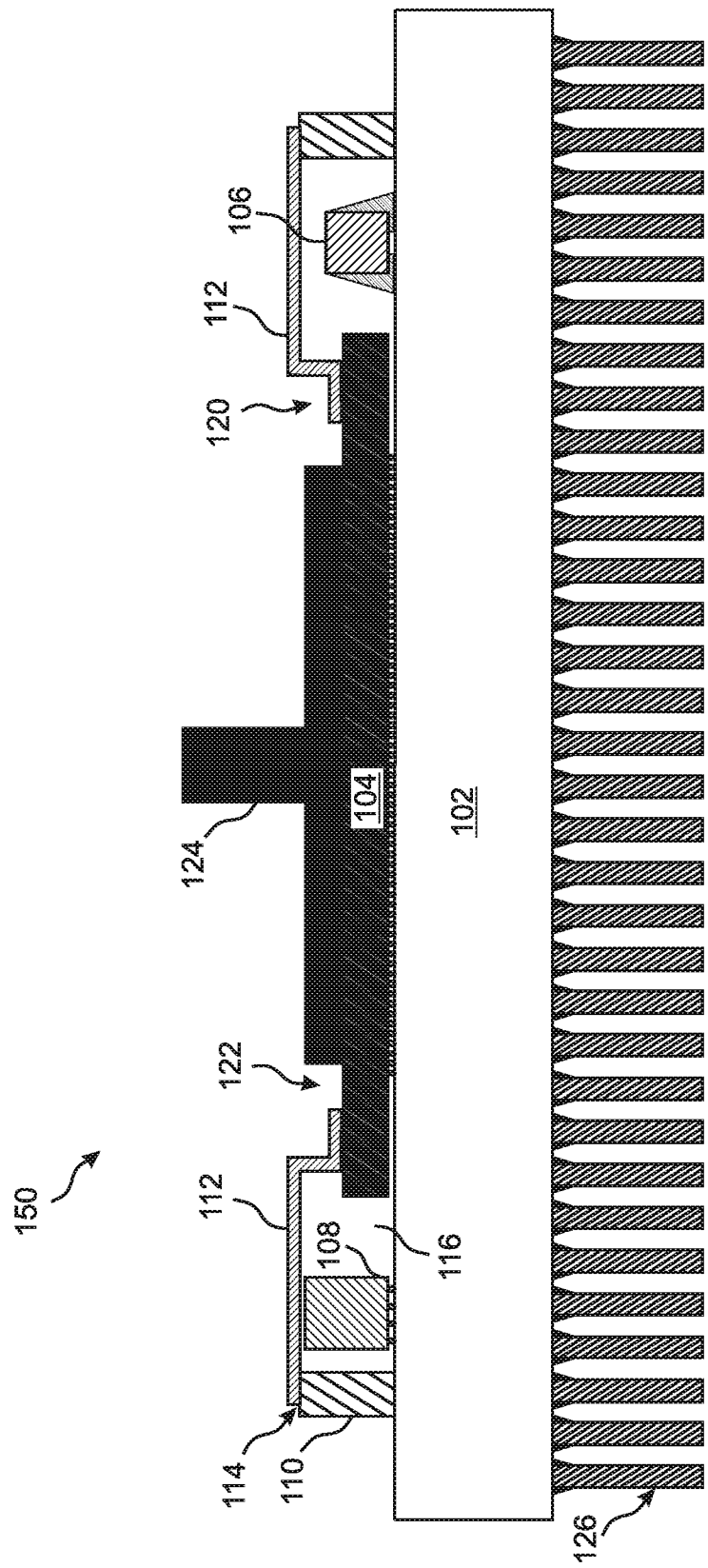
FIG. 1C is a cross-sectional illustration of an alternative hermetically sealed electronics chamber of the prior art.

A thin layer of TIM 118 fills the small gap between the heat spreader 202 and the top of the core IC 104, thereby ensuring a good thermal interface between the heat spreader 202 and the core IC 104, while also reducing the manufacturing tolerance requirements of the apparatus 200. Because this layer of TIM 118 is very thin, as compared e.g. to the prior art approach of FIG. 1A, it does not significantly hinder heat flow from the core IC 104 into the heat spreader 202. Accordingly, heat flows freely from the core IC 104 through the thin layer of TIM 118 and into the heat spreader 202. And because the heat spreader 202 is e.g. soldered or welded to the inner surface of the lid 112, the heat flows from the heat spreader 202 into the lid 112, from which it can be easily removed, for example using a heat extractor similar to the extractor 124 that is illustrated in FIG. 1B.

It should be noted that the term "Core IC" is used herein generically, to refer to any IC or other module or element that is within the hermetically sealed chamber 116 and that requires close contact with the heat spreader 202 for cooling thereof.

In embodiments, the heat spreader extends beyond the region that is immediately above the core IC, and covers a significant area of the top of the hermetically sealed chamber, while avoiding regions that are directly above any "tall" components in the hermetically sealed chamber, where "tall" components are defined in this context to be components within the hermetically sealed chamber that are taller than the core IC. This approach ensures maximum transfer of heat from the heat spreader 202 to the lid 112. Furthermore, many core ICs 104 do not generate heat uniformly across their surfaces, but instead have a 'hot spot' on their upper surface where a disproportionate amount of heat is dissipated, as compared to other parts of the IC 104. In these situations the heat spreader 202 can be effective in rapidly disbursing the heat from these 'hot spots' uniformly across the core IC 104, and in embodiments across a larger region of the lid 112 that extends beyond the core IC 104. This approach can prevent the temperatures of the core IC 104 semi-conductor junctions that lie in the 'hot spot' region from exceeding their maximum specified limits, thereby allowing wider use of the core IC 104 and of the apparatus 200.

FIG. 2B is a close-up cross sectional view showing the relationship between the lid 112, heat spreader 202, TIM 118 and core IC 104.

Figure 3:
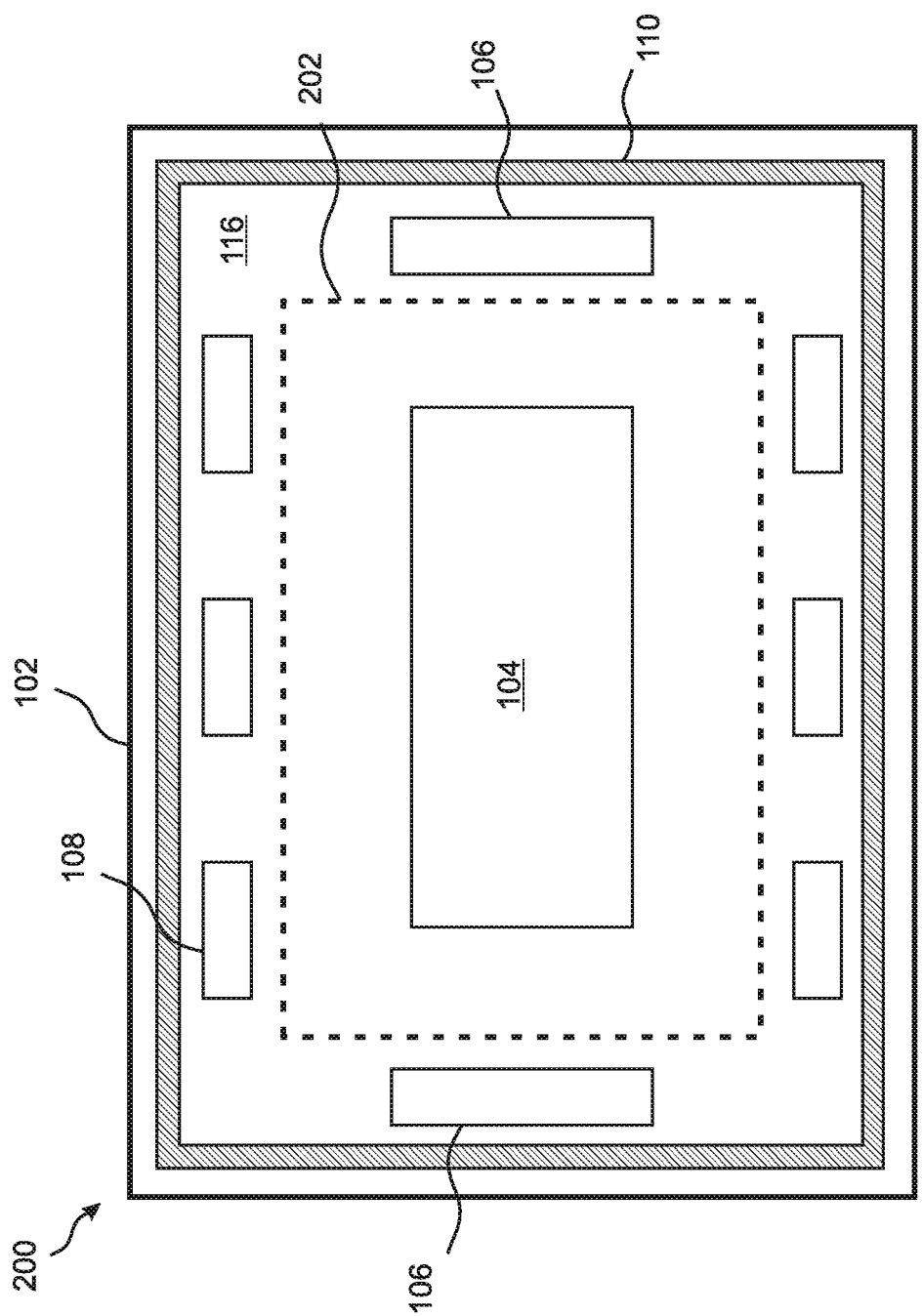
FIG. 3 is a top view of an embodiment of the present disclosure that is similar to the embodiment of FIG. 2A.

With reference to FIG. 3, some embodiments are configured such that all of the "tall" components 106, 108 are located near the periphery of the apparatus 200, such that the heat spreader 202 can be confined to a central region of the lid 112. In the embodiment of FIG. 3, for example, the heat spreader 202 is shaped as a simple rectangle.

Figure 4A:
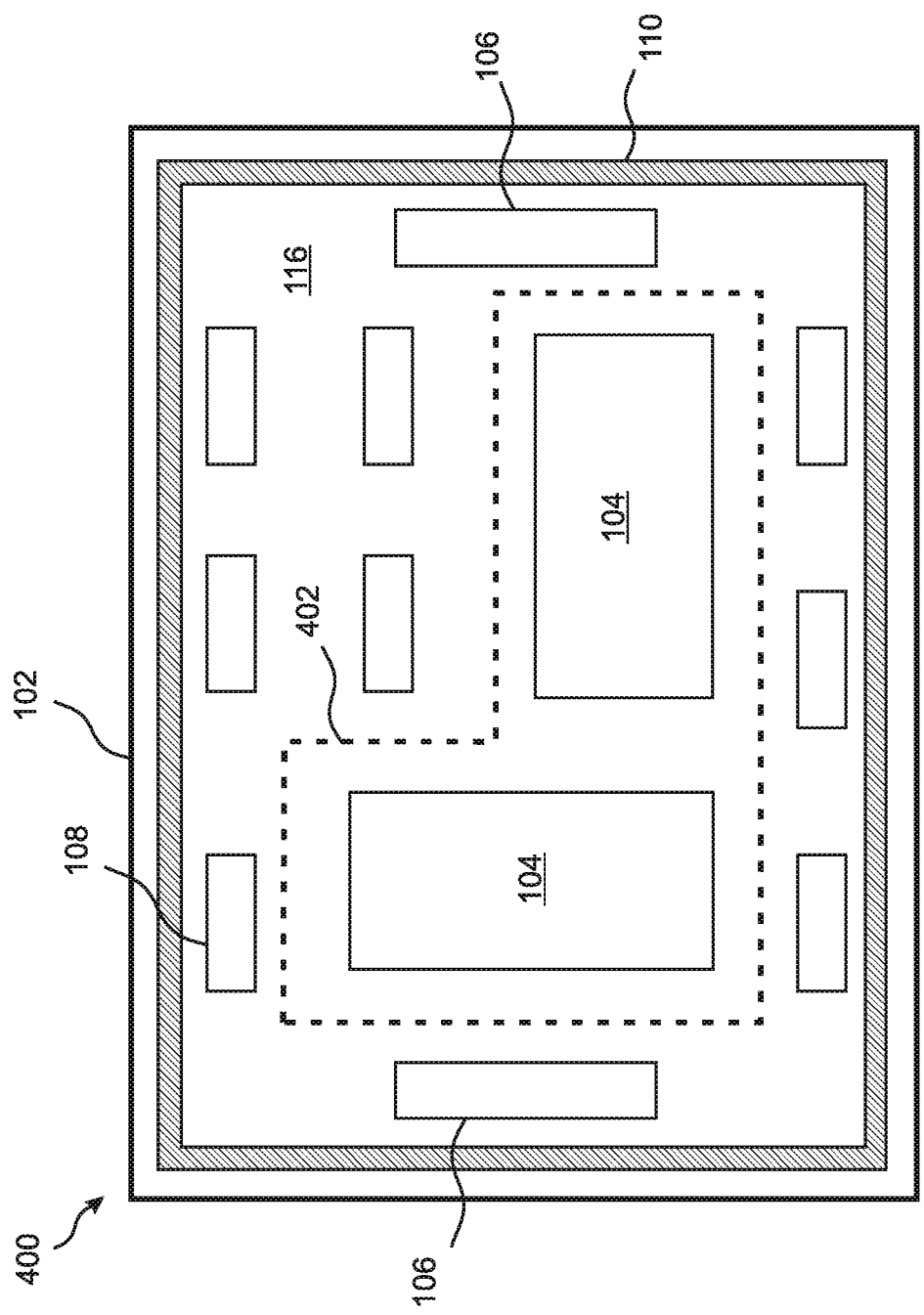
FIG. 4A is a top view of an alternate embodiment of the present disclosure.

With reference to FIG. 4A, embodiments 400 can include more than one "core" IC 104, and/or the tall components 106, 108 can be distributed more generally throughout the hermetically sealed chamber 116, and not necessarily confined to the periphery. In these embodiments, the heat spreader is configured with a more complex shape. For example, in FIG. 4 the heat spreader 402 is configured with an "L" shape that extends above both of the core ICs 104 but avoids the various tall components 108 that are offset from the periphery.

Figure 4B:
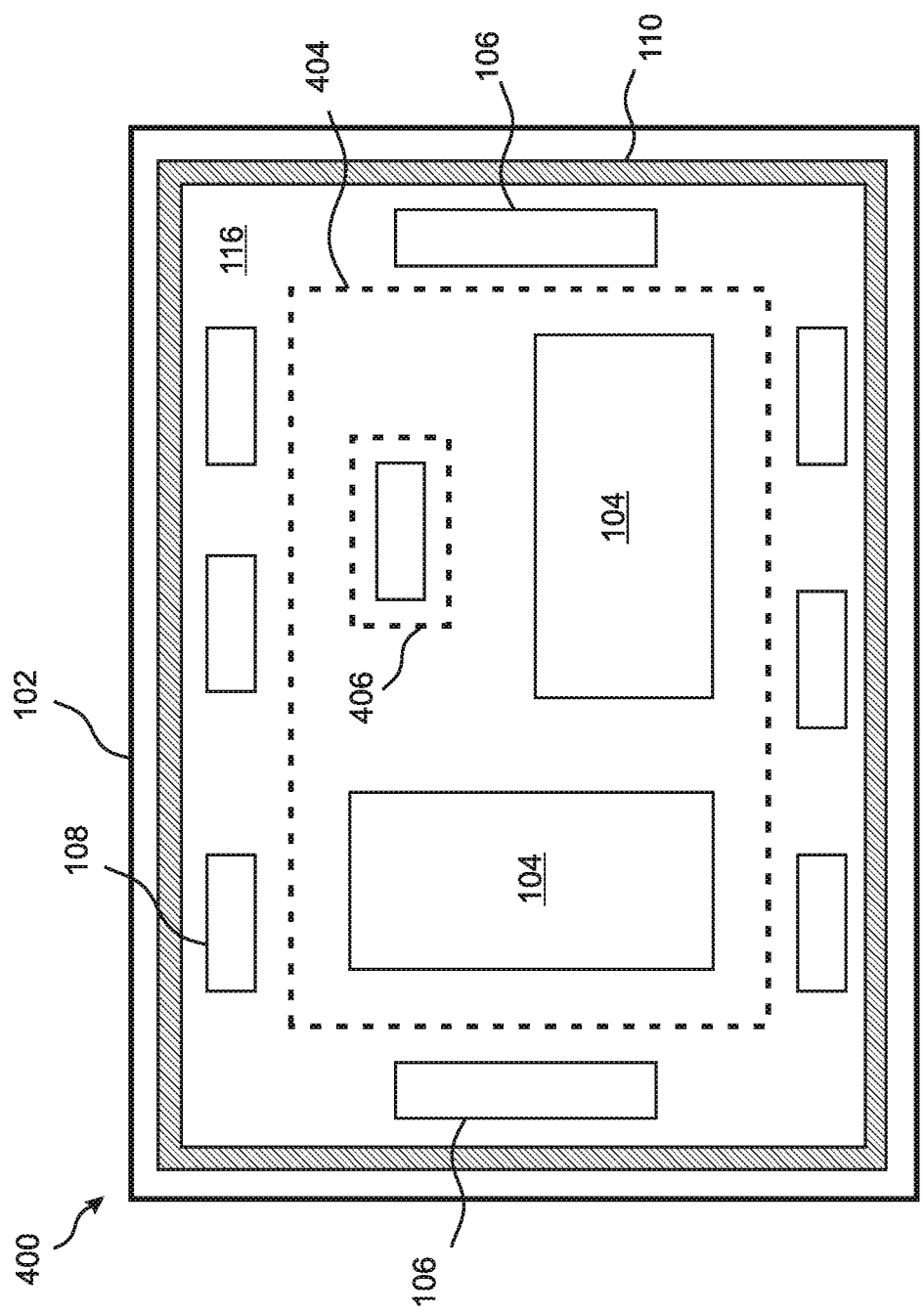
FIG. 4B is a top view of yet another embodiment of the present disclosure.

With reference to FIG. 4B, similar embodiments include holes 406 in the heat spreader 404 that are positioned over corresponding tall elements 108 within the hermetically sealed chamber 116. In some embodiments that include a plurality of core ICs 104 that differ in height, the thickness of the heat spreader varied so as to be proximal to the upper surfaces of each of the core ICs 104 according to their heights.

In embodiments, the lid 112 and/or collar 110 are made a metal alloy such as Kovar™ having a thermal expansion coefficient that is similar to glasses and ceramics (note: Kovar is a trademark of CRS Holdings, Inc., Delaware, USA), so as to reduce thermal stresses between the metallic components and the underlying, ceramic substrate 102. In various embodiments, the heat spreader 202 is made from molybdenum.

Figure 5:
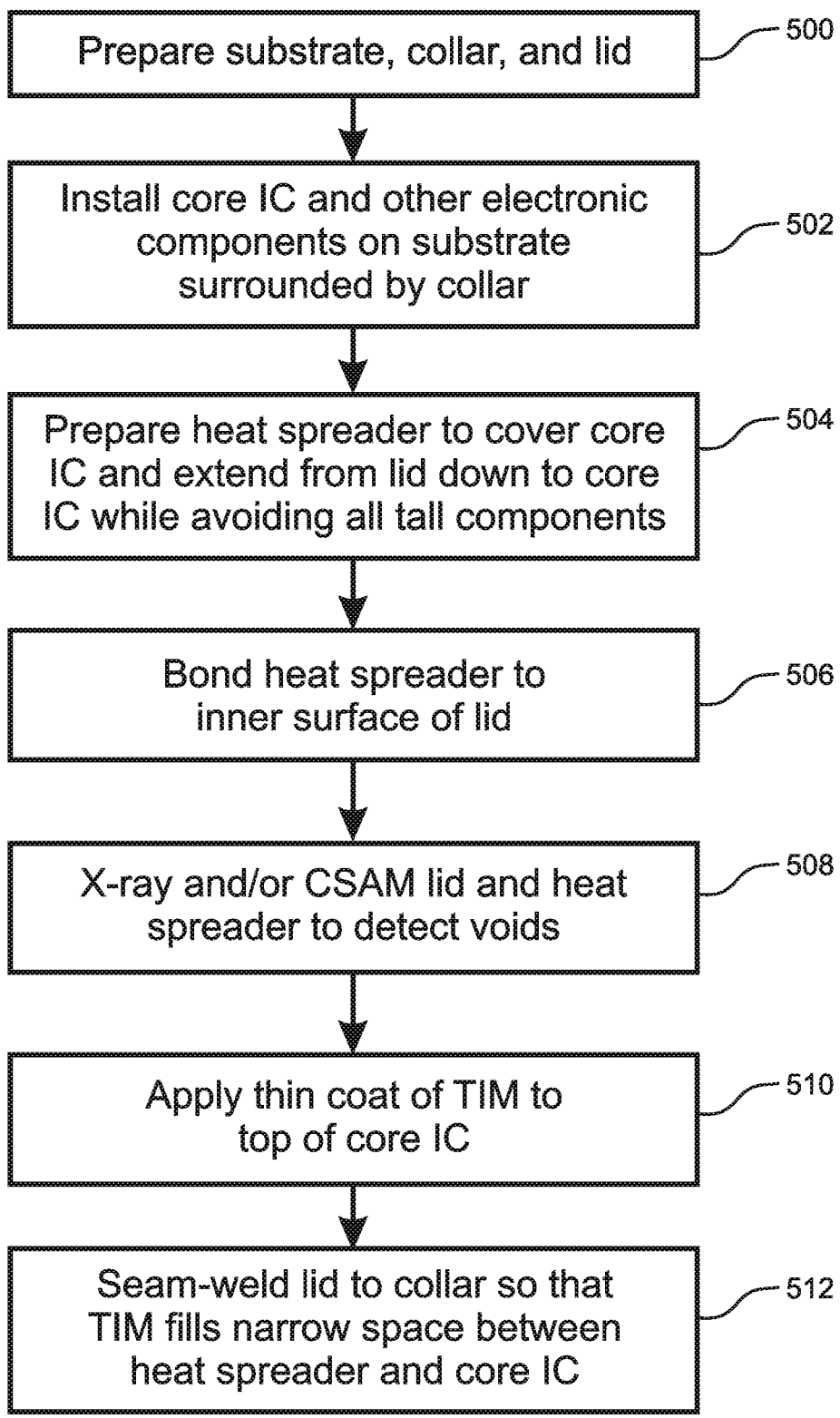
FIG. 5 is a flow diagram that illustrates a method that is included in the present disclosure.

With reference to FIG. 5, a method of manufacturing a hermetically sealed electronic module is also disclosed herein. According to the disclosed method, a substrate 102, collar 110, and lid 112 are prepared 500 that are configured, when assembled, to form a hermetically sealed chamber 116. The collar 110 is welded, soldered, or otherwise hermetically bonded to the substrate 102, and the core IC 104 is installed on the substrate 502, together with any other required components 106, 108, so that they are surrounded and encircled by the collar 110. A metallic heat spreader 202, such as a molybdenum heat spreader, is configured 504 according to the placement of the electronic components 104, 106, 108 so that it will overlap the core IC 104, and any "short" components 106 (i.e. shorter than the core IC 104), but will not overlap any "tall" components 108 in the chamber 116. The heat spreader 202 is soldered, welded, or otherwise bonded 506 to the internal surface of the lid 112, for example by using gold-tin solder.

In embodiments, the combined lid 112 and heat spreader 202 are then tested 508 using X-ray and/or CSAM scanning to detect any voids between the lid 112 and the heat spreader 202. If there are too many voids, then the lid 112 and heat spreader are rejected and new items are prepared and bonded together. In embodiments, the bond between the lid 112 and the heat spreader 202 includes a fillet (not shown) implemented around the edge of the heat spreader202 that enhances the mechanical strength of the bond.

A thermal interface compound (TIM) is applied 510 at least to the top of the core IC 104, and the lid 112 is placed on the collar 110 so as to bring the heat spreader 202 into close proximity to the top of the core IC 104 with a thin layer of TIM extending therebetween, whereupon the lid is seam welded or otherwise bonded 512 to the collar, thereby forming the hermetically sealed chamber 116. In embodiments, the chamber 116 is entirely filled with TIM.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the disclosure is not limited to just these forms, but is amenable to various changes and modifications without departing from the spirit thereof. The disclosure presented herein does not explicitly disclose all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

We claim:

1. A hermetically sealed electronics module, comprising:
   an interconnecting substrate;
   a core integrated circuit (IC) installed on the substrate;
   a collar having a bottom edge hermetically bonded to the substrate, said collar being configured such that it surrounds and encircles the core IC;
   a lid hermetically sealed to a top edge of the collar, the lid, collar, and substrate together forming and enclosing a hermetically sealed chamber that contains the core IC;
   a heat spreader bonded to an inward-facing surface of the lid and positioned within the hermetically sealed chamber over the core IC, the heat spreader extending downward from the lid into proximal, thermal contact with an upper surface of the core IC;

a tall component installed on the interconnecting substrate within the hermetically sealed chamber, the tall component extending upward from the substrate to a height that is greater than a height of the upper surface of the core IC, the heat spreader being configured such that it does not overlap the tall component, and such that it extends downward below the height of the tall component;

wherein a plurality of core ICs are installed on the interconnecting substrate within the hermetically sealed chamber;

wherein the heat spreader is positioned within the hermetically sealed chamber over all of the core ICs;

wherein the heat spreader extends downward from the lid into proximal, thermal contact with upper surfaces of all of the core ICs; and wherein at least two of the core ICs differ in height, and wherein a thickness of the heat spreader is non-uniform, and is varied so as to be proximal to the upper surfaces of the core ICs according to their heights.

2. The module of claim 1, wherein the module comprises a plurality of tall components installed on the interconnecting substrate, all of the tall components extending upward from the substrate to heights that are greater than the height of the upper surface of the core IC, the heat spreader being configured such that it does not overlap any of the tall components, and such that it extends downward below the heights of all of the tall components.

3. The module of claim 2, wherein all of the tall components are installed within the hermetically sealed chamber proximal to the collar, and wherein the heat spreader is confined to a central region of the lid.

4. The module of claim 2, wherein at least one of the tall components is a central tall component that is located within a central region of the interconnecting substrate, and wherein an opening is provided in the heat spreader above the central tall component so that the heat spreader surrounds but does not overlap the central tall component.

5. The module of claim 1, wherein the heat spreader is bonded to the lid over substantially an entire upper surface of the heat spreader.

6. The module of claim 1, wherein the heat spreader is soldered or welded to the lid.

7. The module of claim 1, wherein the proximal, thermal contact between the heat spreader and the upper surface of the core IC is formed by a layer of thermal interface material (TIM) interposed between and in physical contact with both the heat spreader and the upper surface of the core IC.

8. The module of claim 1, wherein the heat spreader is configured to extend beyond the upper surface of the core IC, so that it overlaps a region within the hermetically sealed chamber that is adjacent to the core IC.

9. A method of manufacturing a hermetically sealed electronics module, the method comprising:

a) providing an interconnecting substrate;
b) installing a plurality of core integrated circuits (IC) on the substrate;
c) hermetically bonding a bottom edge of a collar to the substrate so that the collar is in surrounding relationship with the core IC;
d) providing a lid configured for hermetic attachment to a top edge of the collar;
e) bonding a heat spreader to an inward-facing surface of the lid, the heat spreader being configured such that when the lid is hermetically attached to the collar, the heat spreader will be positioned over the core IC within the hermetically sealed chamber, and will extend downward from the lid into proximal, thermal contact with an upper surface of the core IC, said heat spreader being placed such that the heat spreader overlaps the core IC and any components shorter than the core IC but does not overlap any components taller than the core IC; and
f) hermetically attaching the lid to the top edge of the collar, the lid, collar, and substrate together thereby forming and enclosing a hermetically sealed chamber that contains the core IC;

wherein the heat spreader extends downward from the lid into proximal thermal contact with upper surfaces of all the core ICs; and wherein at least two of the core ICs differ in height, and wherein a thickness of the heat spreader is non-uniform, and is varied so as to be proximal to the upper surfaces of the core ICs according to their heights.

10. The method of claim 9, wherein bonding the heat spreader to the inward-facing surface of the lid in step e) includes at least one of soldering and welding the heat spreader to the lid.

11. The method of claim 9, wherein bonding the heat spreader to the inward-facing surface of the lid in step e) includes bonding substantially an entire upper surface of the heat spreader to the inward-facing surface of the lid.

12. The method of claim 9, further comprising after step e) and before step f), applying at least one of X-ray scanning and CSAM (Confocal Scanning Acoustic Microscopy) scanning to the bonded lid and heat spreader.

13. The method of claim 9, further comprising before step f) applying a layer of thermal interface material (TIM) to the upper surface of the core IC, such that after step f) the proximal, thermal contact between the heat spreader and the upper surface of the core IC is formed by the layer of the TIM interposed between an in physical contact with both the heat spreader and the upper surface of the core IC.

14. The method of claim 9, wherein hermetically attaching the lid to the top edge of the collar in step f) includes seam-welding the lid to the top edge of the collar.

15. The method of claim 9, wherein bonding the heat spreader to the inward-facing surface of the lid in step e) includes bonding the heat spreader to the lid over substantially an entire upper surface of the heat spreader.

* * * * *